(12) United States Patent
Yin

(10) Patent No.: US 7,511,955 B2
(45) Date of Patent: Mar. 31, 2009

(54) FAN HOLDER FOR RECEIVING MULTIPLE FANS

(75) Inventor: Xiu-Zhong Yin, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 12 days.

(21) Appl. No.: 11/853,838

(22) Filed: Sep. 12, 2007

(65) Prior Publication Data

US 2009/0021912 A1    Jan. 22, 2009

(30) Foreign Application Priority Data

Jul. 20, 2007    (CN)    .................... 2007 2 0200690 U

(51) Int. Cl.
*H05K 7/20*    (2006.01)
*A45C 13/22*    (2006.01)

(52) U.S. Cl. .................... 361/695; 165/80.3; 174/16.1; 415/213.1

(58) Field of Classification Search ................ None
See application file for complete search history.

(56) References Cited

U.S. PATENT DOCUMENTS

| 6,005,770 | A  | * | 12/1999 | Schmitt ................. 361/695 |
| 6,115,250 | A  | * | 9/2000  | Schmitt ................. 361/695 |
| 6,169,656 | B1 |   | 1/2001  | Pei et al. |
| 6,213,819 | B1 | * | 4/2001  | Fan ....................... 439/894 |
| 6,406,257 | B1 | * | 6/2002  | Houdek ............... 415/213.1 |
| 7,236,361 | B2 | * | 6/2007  | Cote et al. ............. 361/695 |
| 7,301,768 | B2 | * | 11/2007 | Fan et al. .............. 361/695 |
| 7,304,843 | B2 | * | 12/2007 | Peng et al. ............ 361/687 |
| 2001/0028550 | A1 | * | 10/2001 | Miyake et al. ......... 361/695 |

* cited by examiner

*Primary Examiner*—Boris L Chervinsky
(74) *Attorney, Agent, or Firm*—Frank R. Niranjan

(57) ABSTRACT

A fan holder for mounting fans includes a first plate having a plurality of airflow openings, and a second plate having a plurality of airflow openings aligned with the airflow openings of the first plate, thereby forming a plurality of rooms for mounting the fans between the first plate and the second plate, an airflow-blocking member has an engaging piece on an upside and a flange on an underside, the engaging piece and the flange of the airflow-blocking member engage on the first plate, thereby the airflow-blocking member is mounted on the first plate to close the airflow opening.

14 Claims, 5 Drawing Sheets

FAN HOLDER FOR RECEIVING MULTIPLE FANS

1. FIELD OF THE INVENTION

The present invention relates to a fan holder, and more particularly to a fan holder for adjustable directing airflow when no fan is mounted.

2. DESCRIPTION OF RELATED ART

In the computer industry, different kinds of servers are developed to satisfy different demands. For example, network servers provide network service, storage servers are used to store a mass of data, and operation servers possess quick operation functions, and so on. Thus, a plurality of hard disks is installed in the storage servers, and a plurality of central processing units is secured on motherboards in the operation servers, which generate a large amount of heat in the servers. For dissipating heat in each server, a fan bracket is installed in the server, and the fan bracket forms a plurality of rooms for mounting a plurality of fans therein to cool the server.

Different servers have different heat dissipating needs. Some servers have higher heat dissipating needs, and each room of the fan bracket mounts a fan therein. Some servers have lower heat dissipating needs, which generally leaves the fan bracket not fully utilized, as its capacity is greater than the need. However, when the fan bracket is not fully filled with fans, air flows in or out of the server via the unoccupied space of the fan bracket, which influences the orderly flow of air, and lowers dissipation of heat in the server.

What is needed, therefore, is to provide a fan holder, which has a simple structure, and a function of providing orderly airflow.

SUMMARY

A fan holder for mounting fans includes a first plate having a plurality of airflow openings, and a second plate having a plurality of airflow openings aligned with the airflow openings of the first plate, thereby forming a plurality of rooms for mounting the fans between the first plate and the second plate, an airflow-blocking member has an engaging piece on an upside and a flange on an underside, the engaging piece and the flange of the airflow-blocking member engage on the first plate, thereby the airflow-blocking member is mounted on the first plate to close the airflow opening.

Other advantages and novel features of the present invention will become more apparent from the following detailed description of an embodiment when taken in conjunction with the accompanying drawings, in which:

DETAILED DESCRIPTION

Figure 1:
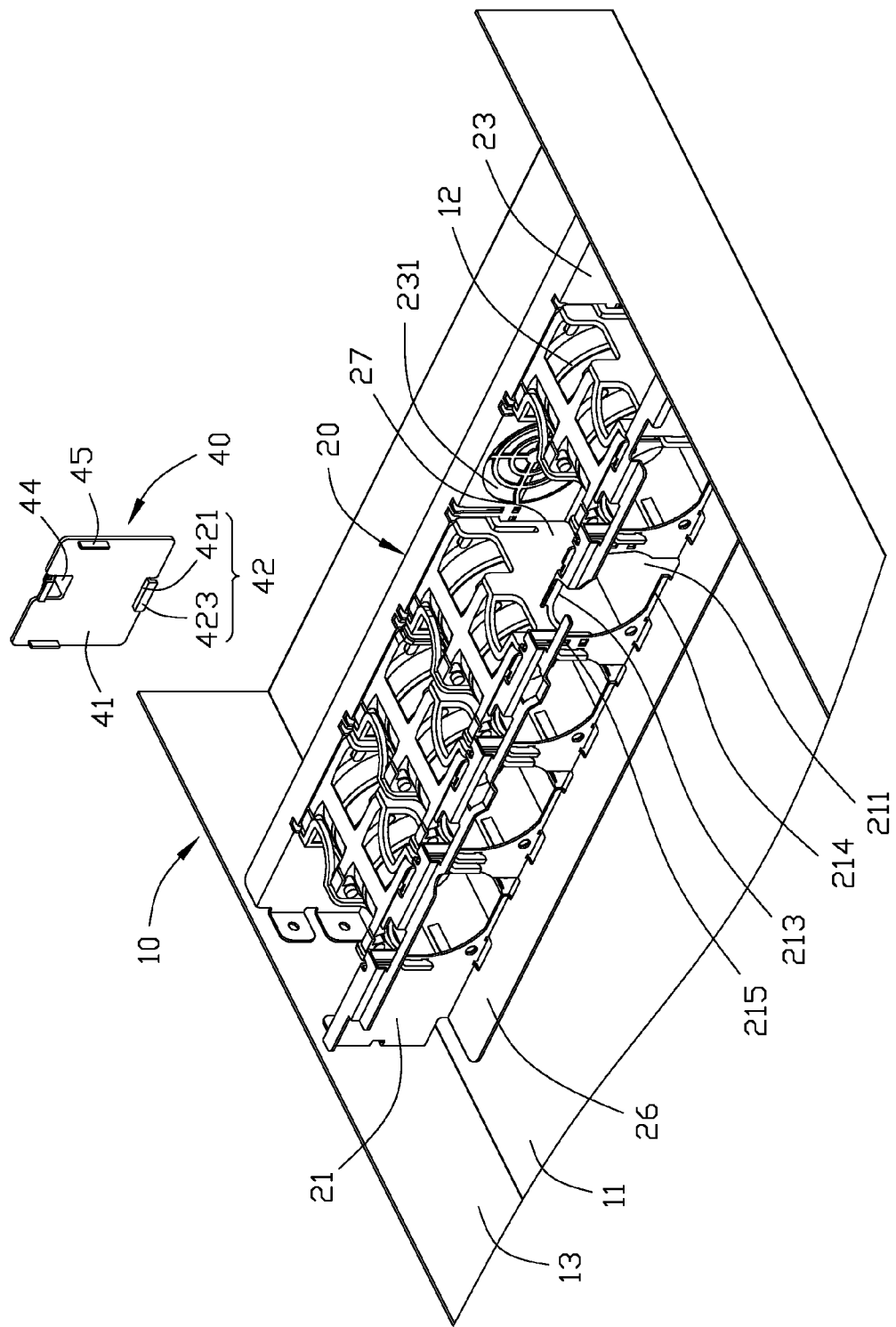
FIG. 1 is an exploded, isometric view of a fan holder according to an embodiment of the present invention and a chassis, the fan holder mounting a plurality of fans.

Referring to FIG. 1, a fan holder 20 of an embodiment of the present invention can be placed within a chassis 10. The chassis 10 includes a bottom plate 11 and two side plates 13 extending perpendicularly upwards from opposite sides of the bottom plate 11.

The fan holder 20 has a first plate 21 and a second plate 23 parallel to the first plate 21. A flange 26 extends perpendicularly outwards from bottom edges of the first plate 21 and the second plate 23 respectively, contacting the bottom plate 11 of the chassis 10. The first plate 21 defines five airflow openings 211 aligned horizontally. A slot 215 is defined in each of two sides of each airflow opening 211. Each slot 215 extends perpendicularly to a top of the first plate 21. The first plate 21 forms a first edge 213 bordering a top of the opening 211, and a second edge 214 bordering a bottom of the opening 211. The second plate 23 corresponding to the five airflow openings 211 of the first plate 21 defines five airflow openings 231 therein, thereby forming five rooms 27 between the first plate 21 and the second plate 23 for receiving fans 12. In the FIG. 1, four rooms 27 of the fan holder 20 receive the fans 12 respectively, only one room 27 does not receive the fan 12. The flanges 26 of the fan holder 20 are located on the bottom plate 11 of the chassis 10, and opposite ends of the first plate 21 and the second plate 23 are secured on the side plates 13 of the chassis 10, thereby the fan holder 20 is secured in the chassis 10.

Figure 2:
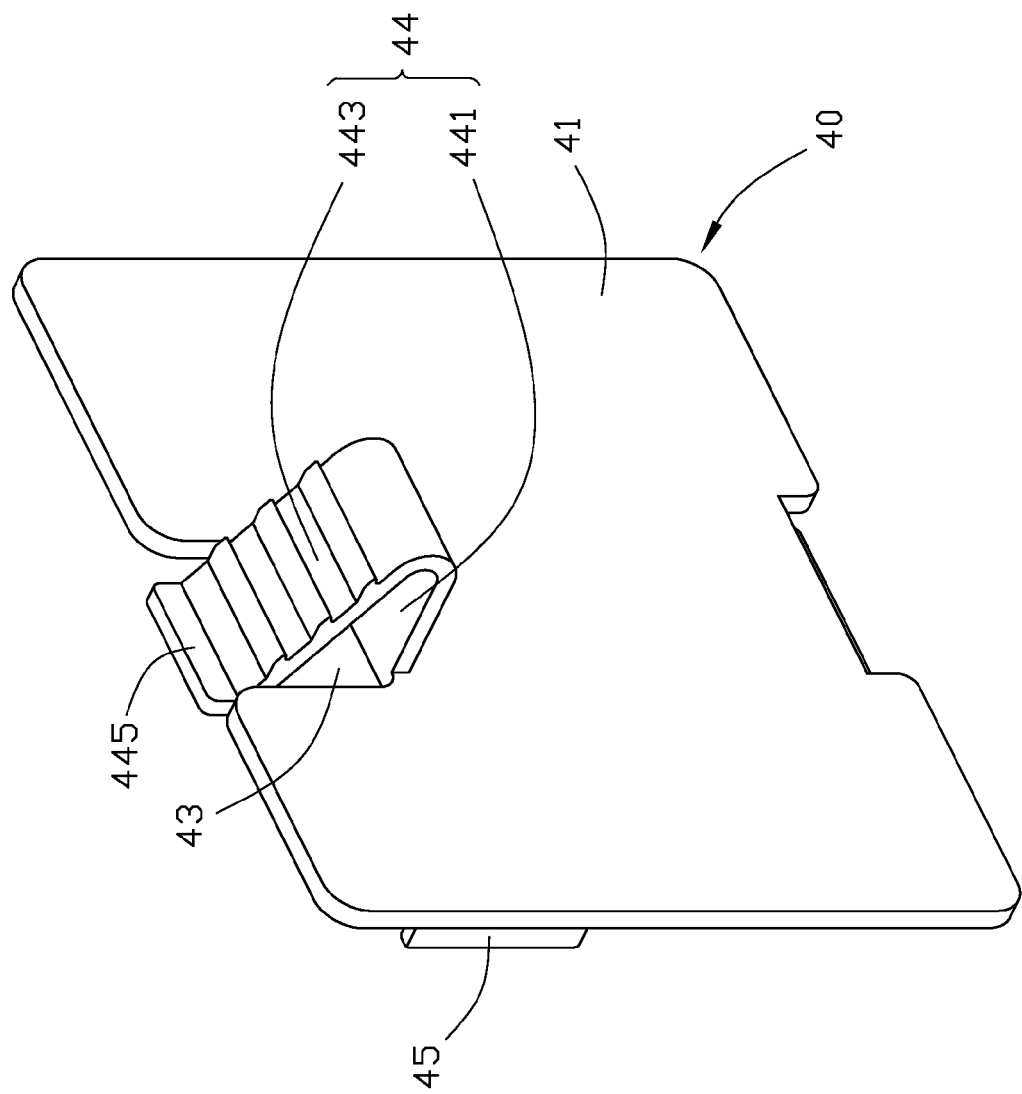
FIG. 2 is an isometric view of an airflow-blocking member of the fan holder of FIG. 1.
Figure 3:
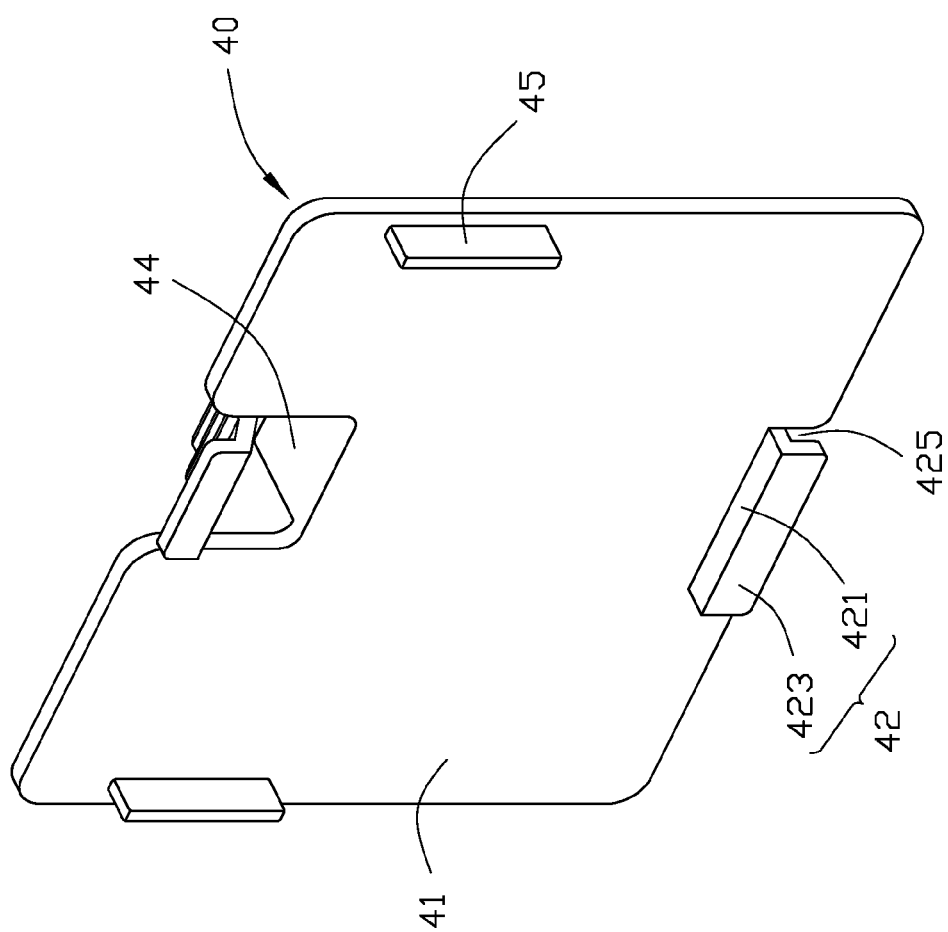
FIG. 3 is similar to FIG. 2, but viewed from another aspect.

Referring to FIGS. 2 and 3, an airflow-blocking member 40 includes a main body 41. A cutout 43 is defined in a top of the main body 41. A first engaging piece 44 extends backwards from a bottom edge of the cutout 43. The first engaging piece 44 includes a cantilever 441 and an inclined resilient arm 443. The cantilever 441 perpendicularly extends rearwards from the bottom edge of the cutout 43, and the resilient arm 443 extends forward and upwards from one end of the cantilever 441 and projects beyond a front side of the airflow-blocking member 40 through the cutout 43. A free end of the resilient arm 443 forms an upright first engaging portion 445. Part of an underside of the main body 41 extends forward and then down to form a second engaging piece 42. The second engaging piece 42 is an L-shaped flange. The flange 42 includes a resisting portion 421 perpendicular to the main body 41, and a second engaging portion 423 parallel to the main body 41. A slot 425 is defined between the second engaging portion 423 and the first plate 21. A pair of protruding pieces 45 is formed on opposite sides of the main body 41 respectively.

Figure 4:
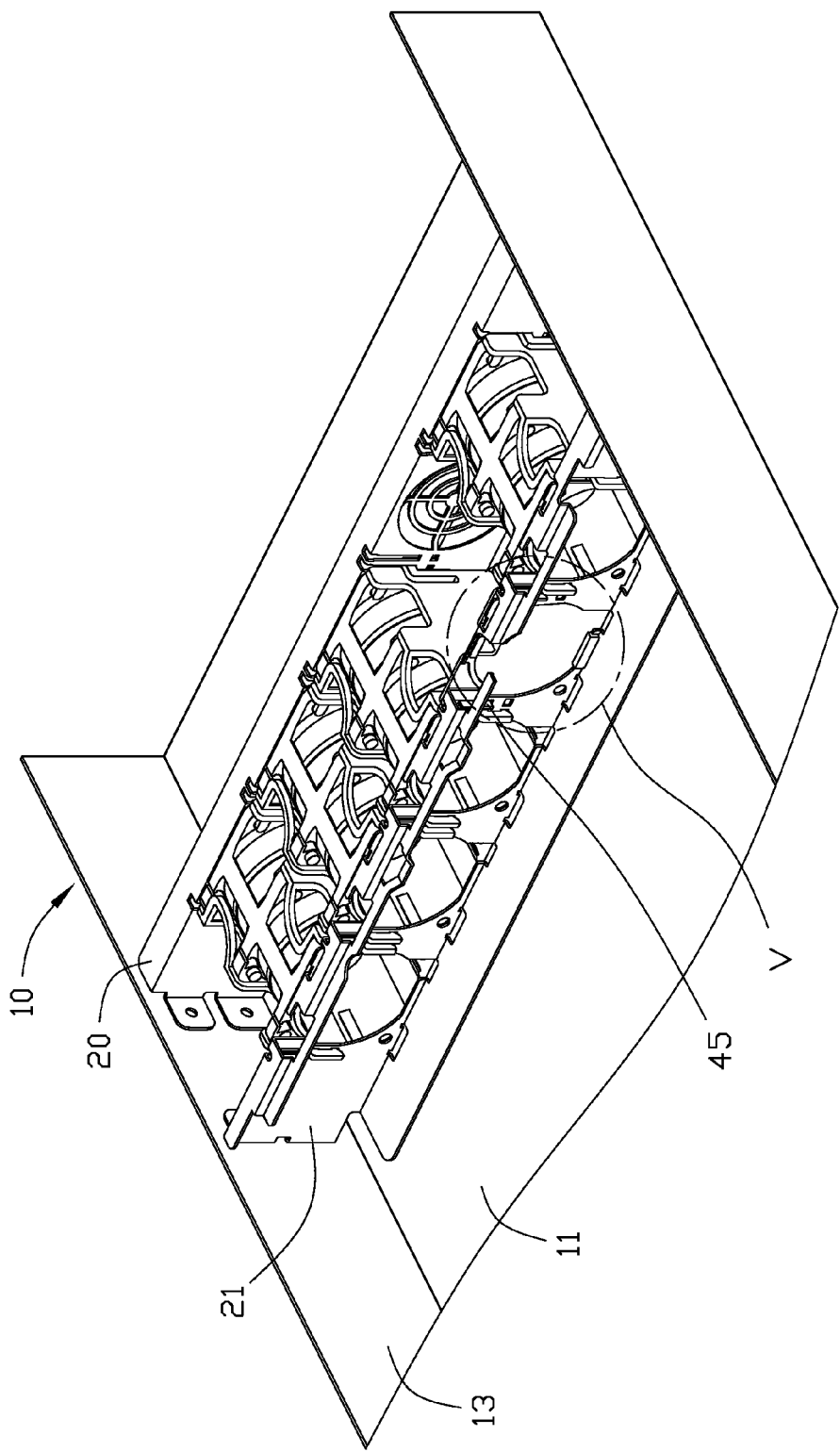
FIG. 4 is an assembled view of FIG. 1.
Figure 5:
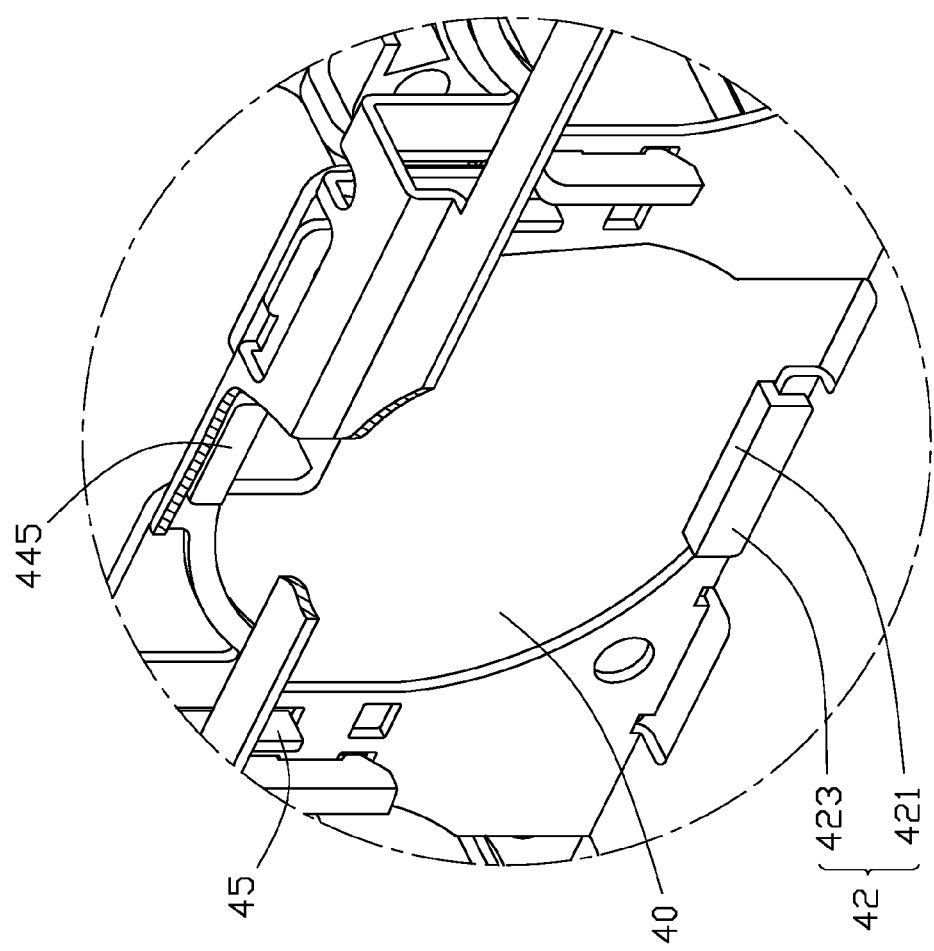
FIG. 5 is an enlarged view of an encircled portion V of FIG. 4.

Referring also to FIGS. 4 and 5, when one room 27 of the fan holder 20 does not receive the fan 12, the airflow-blocking member 40 is used for blocking the airflow opening 211 of the corresponding room 27. The airflow-blocking member 40 is moved downwards, and the main body 41 slides along an inner side of the first plate 21 with the protruding pieces 45 of the airflow-blocking member 40 inserting into the slots 215 of the first plate 21. The resisting portion 421 of the flange 42 of the airflow-blocking member 40 resists against a bottom edge of the airflow opening 211. The second engaging portion 423 engages on an outer side of the first plate 21. Then the top of the airflow-blocking member 40 is moved forward, and the first engaging portion 445 of the first engaging piece 44 resists against the first edge 213 of the first plate 21 to resiliently deform the resilient arm 443 of the first engaging piece 44. The first engaging portion 445 moves from an inner side to an outer side of the first plate 21 until the first engaging portion 445 engages on the outer side of the first plate 21. Thereby, the airflow-blocking member 40 is secured on the first plate 21 to block the airflow opening 211. Then a cover (not shown) is mounted on a top of the chassis 10 to close the chassis 10. When the fans 12 dissipate heat from the chassis 10, airflow cannot flow in the empty room 27, thus insuring orderly efficient airflow in the chassis 10.

To remove the airflow-blocking member 40 and mount the fan 12 in the room 27 instead, the resilient arm 443 of the first engaging piece 44 of the airflow-blocking member 40 is pressed down. The top of the airflow-blocking member 40 is moved backwards, and the first engaging portion 445 of the first engaging piece 44 moves from the outer side to the inner side of the first plate 21 via the first edge 213 of the first plate 21 bordering the top of the opening 211. Thereby, the airflow-blocking member 40 is removed from the first plate 21, and then the fan 12 is mounted in the room 27 of the fan holder 20.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A computer, comprising:
   a chassis;
   a fan holder mounted in the chassis, for receiving a plurality of fans therein, the fan holder comprising a first plate having a plurality of airflow openings, the first plate having two slots respectively defined therein at opposite sides of each of the airflow openings; and
   an airflow-blocking member having an engaging piece at an upper portion thereof, a flange at a lower portion thereof and two protruding pieces at opposite sides thereof respectively, the engaging piece and the flange of the airflow-blocking member engaging with opposite edges of the first plate bordering the airflow opening to secure the airflow-blocking member in a first direction, the two protruding pieces inserted in the slots to secure the airflow-blocking member in a second direction, thereby the airflow-blocking member mounted on the first plate to close the airflow opening.

2. The computer as described in claim 1, wherein the engaging piece includes a resilient arm, and a first engaging portion extending perpendicularly upwards from the resilient arm, the first engaging portion engaging with a first edge of the first plate bordering a top of the airflow opening by resilience of the resilient arm.

3. The computer as described in claim 2, wherein the resilient arm extends from a back side to a front side of the airflow-blocking member, the first engaging portion protruding from a plane of the airflow-blocking member.

4. The computer as described in claim 2, wherein the engaging piece includes a cantilever extending horizontally back from the upside of the airflow-blocking member, and the resilient arm extends upwards and forward from one end of the cantilever.

5. The computer as described in claim 1, wherein the flange includes a resisting portion resisting against a second edge of the first plate bordering a bottom of the airflow opening, and a second engaging portion engaging with the second edge of the first plate.

6. The computer as described in claim 5, wherein the second engaging portion protrudes from the plane of the airflow-blocking member, a slot defined between the second engaging portion and the first plate to receive the second edge of the first plate.

7. The computer as described in claim 1, wherein each slot is upright and extends perpendicularly to a top of the first plate.

8. A fan holder for mounting fans in a computer enclosure, the fan holder comprising:
   a plurality of rooms for receiving fans therein, each of the rooms defining at least one airflow opening adapted for communicating an inner side and an outer side of each room, the rooms including an empty room free of a fan therein; and
   an airflow-blocking member covering the airflow opening of the empty room, the airflow-blocking member comprising a main body, a first engaging piece protruding outwardly and upwardly from a top portion of the main body, and a second engaging piece protruded outwardly and downwardly from an underside portion of the main body, the airflow-blocking member mounted on the fan holder in such a manner that the first engaging piece grips a first edge of the fan holder bordering a top of the opening to engage on the fan holder, and the second engaging piece grips a second edge of the fan holder bordering a bottom of the opening to engage on the fan holder.

9. The fan holder as described in claim 8, wherein the airflow opening is defined in a first plate mounted in front of the rooms, the first engaging piece includes a resilient arm, and a first engaging portion extending perpendicularly upwards from the resilient arm, the first engaging portion engaging with a first edge of the first plate bordering a top of the airflow opening by resilience of the resilient arm.

10. The fan holder as described in claim 9, wherein the resilient arm extends from a back side to a front side of the airflow-blocking member, the first engaging portion protruding from a plane of the airflow-blocking member.

11. The fan holder as described in claim 9, wherein the first engaging piece includes a cantilever extending horizontally back from the upside of the airflow-blocking member, and the resilient arm extends upwards and forward from one end of the cantilever.

12. The fan holder as described in claim 8, wherein the second engaging piece is a flange including a resisting portion resisting against the second edge of the first plate bordering a bottom of the airflow opening, and a second engaging portion engaging with the second edge of the first plate.

13. The fan holder as described in claim 12, wherein the second engaging portion protrudes from the plane of the airflow-blocking member, a slot defined between the second engaging portion and the first plate to receive the second edge of the first plate.

14. The fan holder as described in claim 8, wherein two slots are defined in two sides of the airflow opening respectively, each slot extending upright to a top of the first plate, two protruding pieces are formed on two sides of the airflow-blocking member respectively, inserting into the slots.

* * * * *